United States Patent [19]
Cho

[11] Patent Number: 5,824,603
[45] Date of Patent: Oct. 20, 1998

[54] METHOD OF FORMING A LOW-K LAYER IN AN INTEGRATED CIRCUIT

[75] Inventor: Chih-Chen Cho, Richardson, Tex.

[73] Assignee: Texas Instruments Incorporated, Dallas, Tex.

[21] Appl. No.: 483,422

[22] Filed: Jun. 7, 1995

Related U.S. Application Data

[62] Division of Ser. No. 148,779, Nov. 5, 1993, Pat. No. 5,468,561.

[51] Int. Cl.$^6$ .................................................. H01L 21/302
[52] U.S. Cl. ........................... 438/725; 438/718; 438/694; 216/81
[58] Field of Search ........................... 156/643.1, 661.11; 216/23, 24, 25, 81, 63; 437/228; 438/725, 718, 738, 694

[56] References Cited

U.S. PATENT DOCUMENTS

| | | | |
|---|---|---|---|
| 3,136,680 | 6/1964 | Hochberg | 161/189 |
| 4,530,569 | 7/1985 | Squire | 350/96.34 |
| 4,886,699 | 12/1989 | Carroll et al. | 428/228 |
| 4,933,060 | 6/1990 | Prohaska et al. | 156/643 |
| 5,011,732 | 4/1991 | Takeuchi et al. | 428/209 |
| 5,061,938 | 10/1991 | Zahn et al. | 343/846 |
| 5,282,258 | 1/1994 | Hoshino | 385/70 |
| 5,286,550 | 2/1994 | Yu et al. | 428/12 |
| 5,302,547 | 4/1994 | Wojnarowski et al. | 156/643 |
| 5,312,716 | 5/1994 | Unoki et al. | 430/313 |
| 5,380,474 | 1/1995 | Rye et al. | 156/643 |
| 5,401,687 | 3/1995 | Cole et al. | 437/182 |
| 5,403,437 | 4/1995 | Beratan et al. | 156/668 |
| 5,407,860 | 4/1995 | Stoltz | 437/228 |
| 5,468,561 | 11/1995 | Cho | 428/421 |

FOREIGN PATENT DOCUMENTS

| | | |
|---|---|---|
| 52-055866 | 5/1977 | Japan . |
| 53-113730 | 10/1978 | Japan . |
| 63-278954 | 11/1988 | Japan . |
| 03034558 | 2/1991 | Japan . |
| 04237993 | 8/1992 | Japan . |

OTHER PUBLICATIONS

"Improved Adhession of Copper on Pre–Etched Polytetrafluoroethylene By PECVD Deposited Thin Metallic Layers"; Appl. Phys. A. (1988), A47(2); pp. 199–203; Haag et al.

"Contact Angle Hysteresis In Oxygen Plasma Treated Polytetrafluoroethylene"; Langmuir (1989); 5(3); pp. 872–876; Morra et al.

Primary Examiner—R. Bruce Breneman
Assistant Examiner—George Goudreau
Attorney, Agent, or Firm—David Denker; James C. Kesterson; Richard L. Donaldson

[57] ABSTRACT

This is a device and method of forming such, wherein the device has an amorphous "TEFLON" (TFE AF) layer. The device comprising: a substrate; a TFE AF 44 layer on top of the substrate; and a semiconductor layer 42 on top of the TFE AF 44 layer. The device may be an electronic or optoelectronic device. The semiconductor layer may be a metal or other substance.

11 Claims, 5 Drawing Sheets

METHOD OF FORMING A LOW-K LAYER IN AN INTEGRATED CIRCUIT

This is a divisional of application Ser. No. 08/148,779 filed Nov. 5, 1993, now U.S. Pat. No. 5,468,561.

FIELD OF THE INVENTION

This invention is directed towards the field of fabrication of electronic and optoelectronic components.

BACKGROUND OF THE INVENTION

As device geometries continue to decrease in electronics and optoelectronics, capacitance density will increase and the performance of integrated circuits will be limited by the high RC time constants caused by high resistivity metals and high capacitance interlevel dielectrics (ILD). Reducing the dielectric constant of the interlevel insulator will not only enhance performance, but also decrease the power consumption and crosstalk of electronic/optoelectronic devices.

For a given interconnect layout, both power dissipation and crosstalk decrease as the dielectric constant of the insulator decreases. FIG. 1 shows the power dissipation of 0.25 μm and 0.50 μm metal lines when different ILDs are used. The data show that using the same dielectric, scaling down from 0.50 μm to 0.25 μm will result in a 30% increase in power dissipation. The power dissipation can be decreased more than 50% if $SiO_2$ ILD is replaced by a copolymer made from tetraflouroethylene and 2,2-bis (trifluoromethyl)-4,5-difluoro-1,3-dioxole (TFE AF). (TFE AF is commercially available from "DU PONT" in a product known as amorphous "TEFLON"; "TEFLON" is a polymer made from polytetrafluoroethylene (PTFE) also commercially available from "DU PONT"). This change is particularly important for high frequency operation because power dissipation increases proportional to frequency. The power consumption can be further reduced if a metal of lower resistance, such as Cu, is used to replace current metalization materials such as Al or W.

FIG. 2 shows the crosstalk between 0.25 μm and 0.5 μm metal lines when the power supply voltage ($V_{cc}$) is 1 V. The crosstalk increases more than 50% when the design rule is reduced from 0.5 μm to 0.25 μm, primarily due to the increase in line-to-line capacitance. The increase in crosstalk/$V_{cc}$ ratio degrades the noise margin and hence circuit performance. Replacing $SiO_2$ by TFE AF will significantly reduce crosstalk.

Several material properties are required for a successful low-$\epsilon_r$ technology. These include: 1) low dielectric constant, 2) high mechanical strength, 3) good thermal stability, 4) high dielectric strength and low leakage current, 5) low stress, 6) good adhesion, 7) good gap filling capability/ease of planarization, 8) ease of pattern and etch, 9) low water absorptivity, 10) good etch selectivity to metal and 11) good thermal conductivity. A list of a few important properties of TFE AF, PTFE and $SiO_2$ are given in Table 1. The properties of PTFE and $SiO_2$ are listed for comparison.

TABLE 1

| Requirements | TFE AF | PTFE | $SiO_2$ |
| --- | --- | --- | --- |
| Dielectric Constant | 1.9 | 2.1 | 3.5–4.0 |
| Dissipation Factor | <0.00035 | <0.0002 | 0.001 |
| Stable Temperature | 360° C. | 380° C. | 1600° C. |
| Creep Resistance | good | poor | good |
| Resistivity (ohm-cm) | >$10^{18}$ | >$10^{18}$ | $10^{14-17}$ |
| Dielectric Strength | 0.2 (MV/cm) | 1.3 | 5–8 |
| Thermal Conductivity | | | 0.012 |
| Chemical Resistance | excellent | excellent | |
| Water Absorption | <0.01% | <0.01% | |

No single polymer exhibits all of the required characteristics. TFE AF has the lowest dielectric constant in known polymers. In addition, TFE AF has processing advantages. Unlike PTFE, which is formed by molding, TFE AF can be deposited as a thin film by either spin-coating, thermolysis or laser ablation. This makes it more applicable to integrated circuits. TFE AF exhibits better creep resistance, a lower dielectric constant, lower thermal expansion and higher tensile strength than PTFE. Good chemical resistance and low water absorption are common for both materials.

SUMMARY OF THE INVENTION

TFE AF films can be deposited on Al, $SiO_2$, $Si_3N_4$, Si and other material substrates by spin-coating, using TFE AF. The thickness of the films can be varied from <5 nm to >1200 nm by diluting the TFE AF solution with Fluorinert FC-75 (made by "3M"). In addition, the thickness of the films can be controlled by using different spin speeds. Initial results indicate all films on the above-listed substrates pass the Scotch tape test. In contrast, films deposited on the TFE AF layers tend to peel off during subsequent processing. In fact, the TFE AF surface is so non-sticky that photoresist could not be put on by spin-coating. In addition to the problem of putting on patterned photoresist, the TFE AF films have to be etchable. However, since the TFE AF has good chemical resistance, it is difficult to etch by wet chemicals. Finally, since the surface of a spin-coated TFE AF films is wavy, it may be necessary to planarize the films by an etch-back process. That also demands an etching process.

Accordingly, improvements which increase the patternability, etchibility and adhesion of TFE AF are presently desirable. The present invention is directed towards meeting those needs.

Although wet chemical is of little use in etching the TFE AF film, dry etching is found to be very efficient. The TFE AF films have been etched in Ar, $O_2$ or $CF_4+O_2$ plasma gases effectively. Dry etching also increases the surface roughness of the TFE AF films. The increased surface roughness and a possible chemical change on the TFE AF films, making it suitable for photoresist spin-coating and patterning. In addition, adhesion to other materials deposited over the TFE AF has been increased.

This is a device and method of forming such, wherein the device has a TFE AF layer. The device may comprise: a substrate; a TFE AF layer on top of the substrate; and a material layer on top of the TFE AF layer. The device may be an electronic or optoelectronic device. The material layer may be a metal or other substance.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF THE PREFERRED EMBODIMENTS

Figure 1:
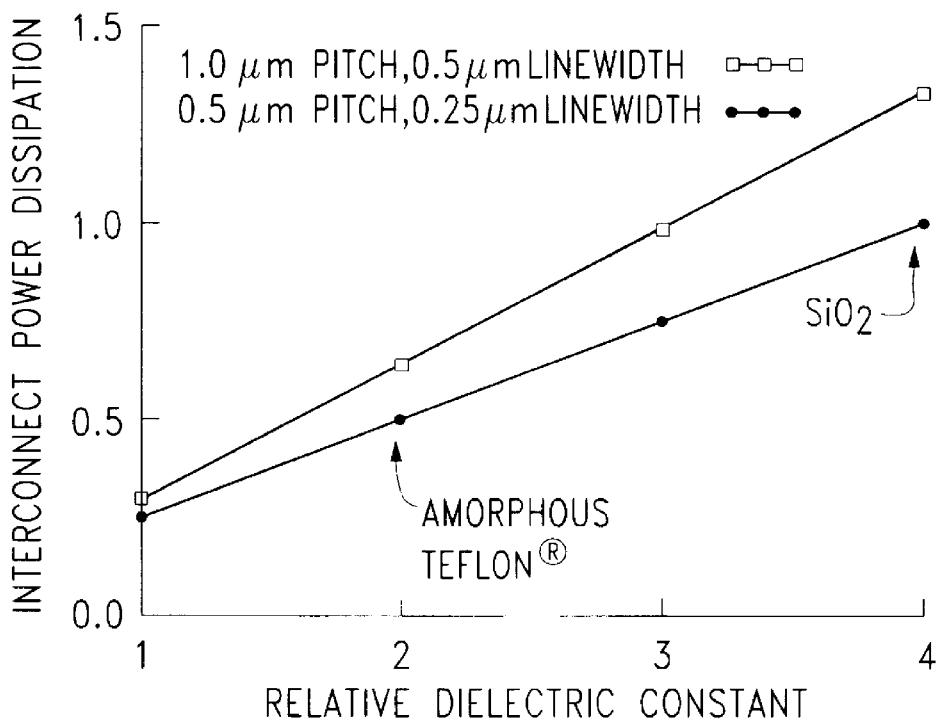
FIG. 1 is a graph of the power dissipation of 0.25 μm and 0.50 μm metal lines when different ILDs are used.
Figure 2:
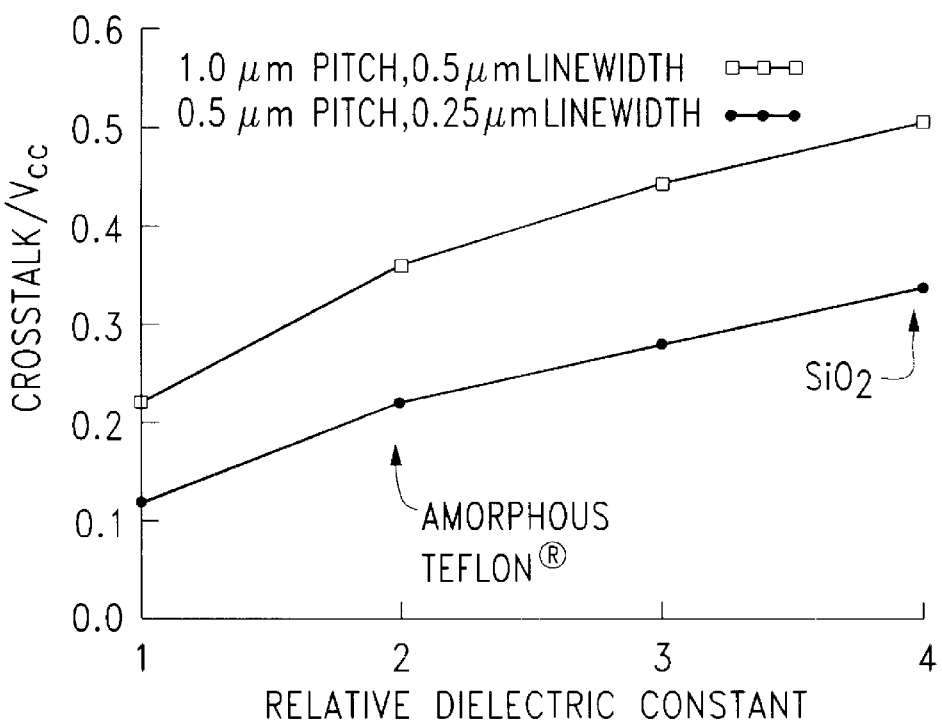
FIG. 2 is a graph of the crosstalk between 0.25 μm and 0.5 μm metal lines when the power supply voltage ($V_{cc}$) is 1 V.
Figure 3:
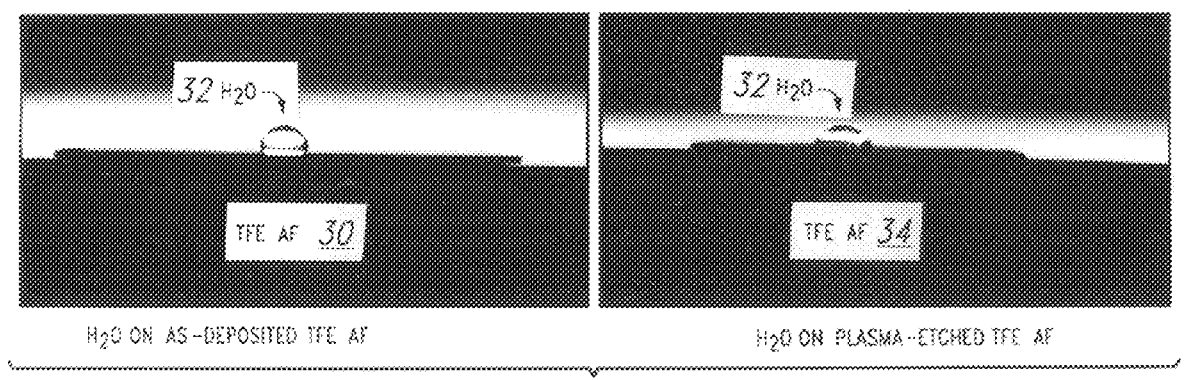
FIG. 3 is a micrograph of the change in contact angle for water droplets on as-deposited and plasma-etched TFE AF.

Dry etching was performed in a plasma etcher (by Technics) with the process pressure at 350 mtorr and input power of 50W. At these settings, the etching rates of TFE AF in Ar, $O_2$ and $CF_4$(8%)+$O_2$ are 100, 500, and 500 nm/min, respectively. Although Ar, $O_2$ and $CF_4$(8%)+$O_2$ gases have been used effectively, $O_2$ demonstrated superior results. The etched TFE AF surface was characterized by atomic force microscopy (AFM), and x-ray photoelectron spectroscopy (XPS). These investigations showed that plasma etching created a rough surface and induced chemical changes in the film surface. The increase in surface roughness promotes adhesion, and makes it possible to spin-coat photoresist with adequate uniformity and full coverage on the etched TFE AF films. The chemical changes, along with increased surface roughness increases the adhesion of other materials (such as Al, TiW, etc.) to TFE AF. FIG. 3 shows the change in contact angle for water droplets 32 on an as-deposited 30 and a plasma-etched 34 TFE AF film. The smaller contact angle of water and photoresist solution on the plasma-etched TFE AF film indicates that adhesion of water and photoresist solution on the TFE AF film has been increased. Although photoresist can not stay on an as-deposited TFE AF film by spin-coating, uniform and fully covered photoresist can be achieved on a plasma-etched TFE AF film. The photoresist-covered TFE AF films can then be patterned and etched by standard lithography processes.

Figure 4:
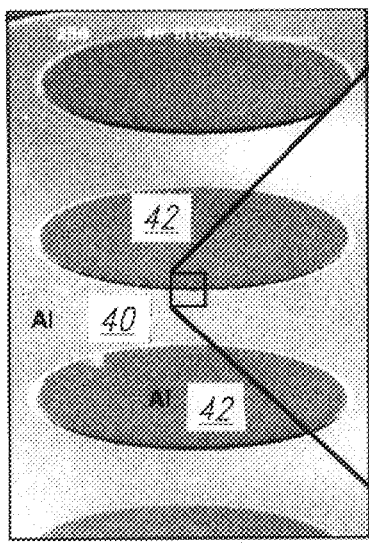
FIG. 4 is a micrograph of a Al/TFE AF/Al/Si(100) capacitors built in accordance the invention.
Figure 5:
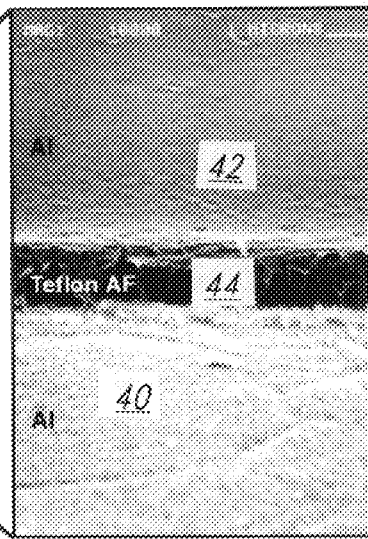
FIG. 5 is a micrograph of the edge of the capacitor in FIG. 4.
Figure 6:
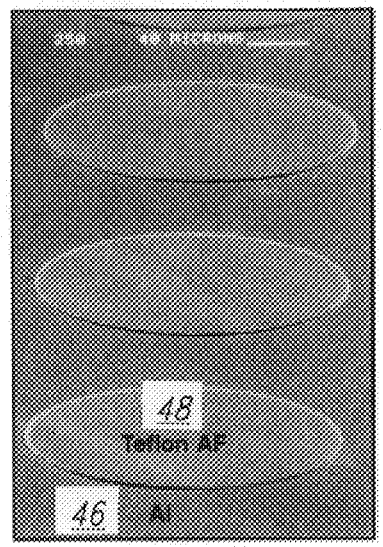
FIG. 6 is a micrograph of a TFE AF mesa built in accordance with the invention.

This patterning process was successfully used to fabricate Al/TFE AF/Al capacitors and TFE AF mesa structures. The procedure is used to fabricate the Al/TFE AF/Al/Si(100) capacitors shown in FIG. 4. To fabricate the Al/TFE AF/Al capacitors, a photoresist layer was first spin-coated on plasma-etched TFE AF 40 over Al 40 and Si(100). The photoresist was exposed to UV light and developed to form a patterned photoresist film on the TFE AF layer. An Al film 42 was then deposited on the patterned photoresist and the exposed area of the TFE AF layer 44. After lifting off the photoresist, the Al dots 42 on the TFE AF 44 was used as masks during the following $CF_4/O_2$ plasma etching. The plasma etching removed exposed TFE AF and stopped at the Al layer 40 underneath the TFE AF film 44. The edge of a capacitor in FIG. 4 is shown in FIG. 5. The same patterning process can be used to form TFE AF mesa as shown in FIG. 6. FIG. 6 shows TFE AF 48 over Al 46. In addition, materials (such as Al, TiW, etc.) can then be deposited over the patterned TFE AF because the adhesion has been increased.

Figure 7:
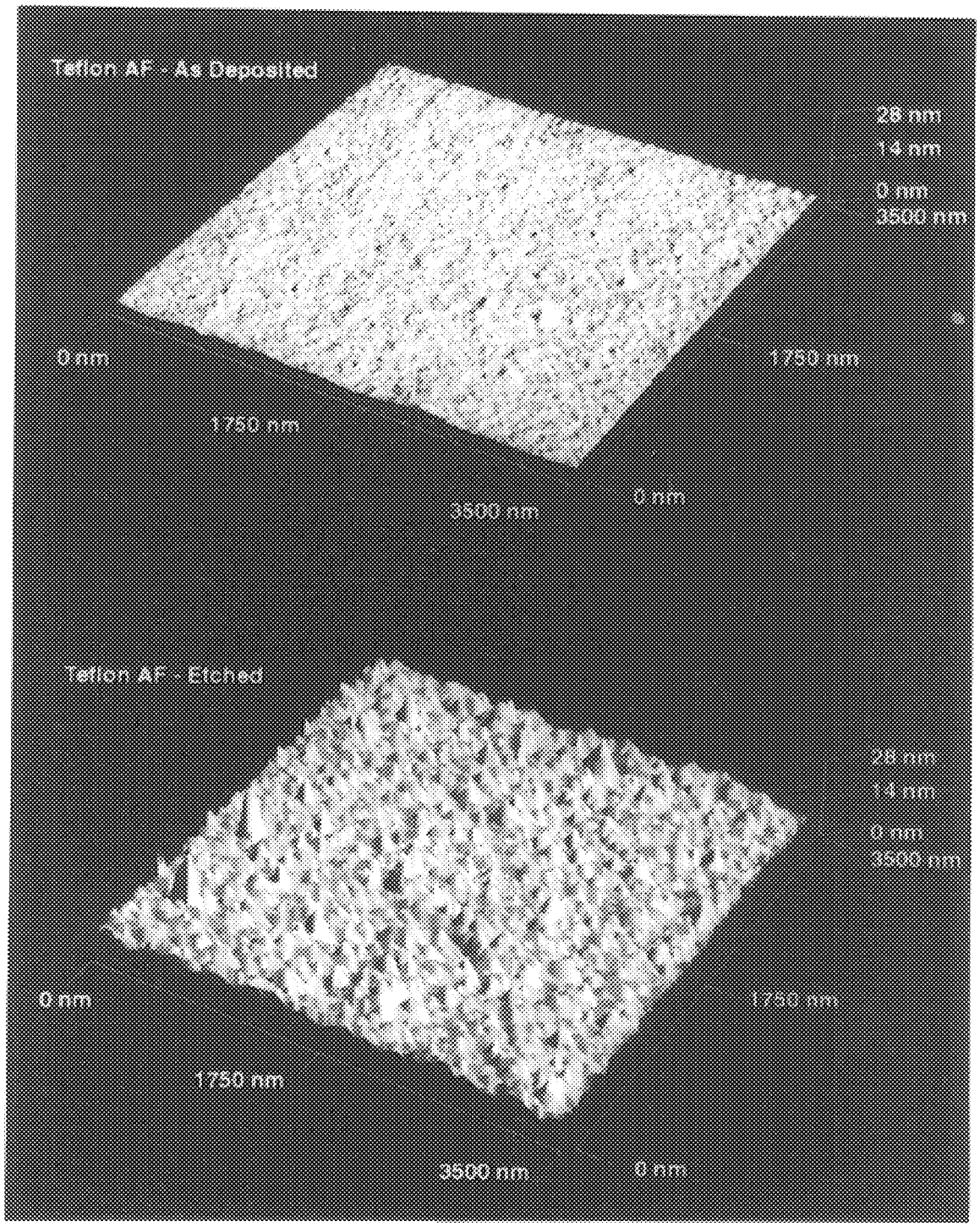
FIG. 7 is micrographs of as-deposited and plasma-etched TFE AF films studied by atomic form microscopy (AFM)

FIG. 7 shows micrographs of as-deposited and plasma-etched TFE AF films studied by atomic form microscopy (AFM). It is clearly shown that the film etched in plasma is rougher than the as-deposited film.

Figure 8:
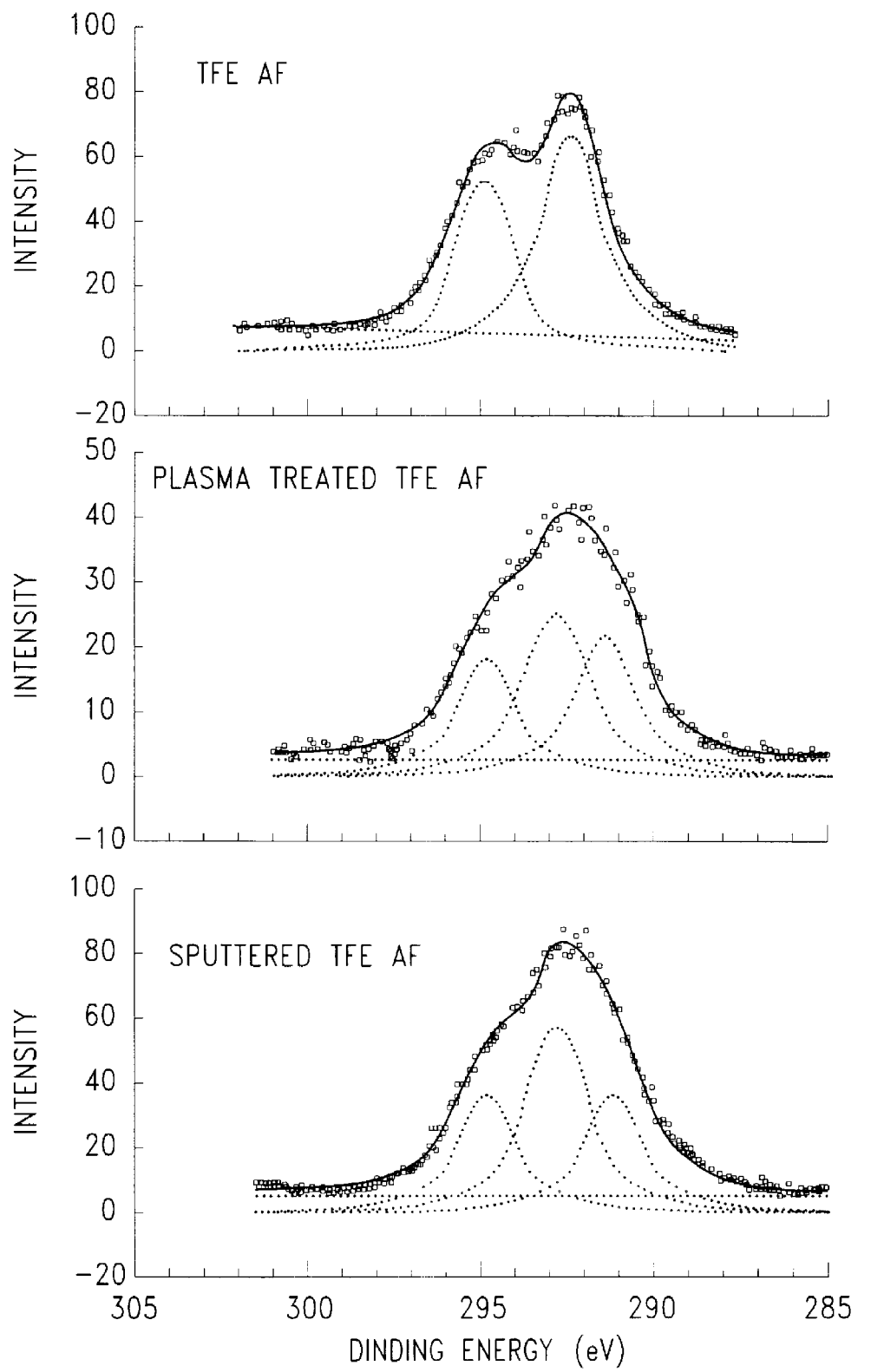
FIG. 8 is Cls spectra of as-deposited, plasma-etched, and Ar-ion sputtered TFE AF films.

FIG. 8 shows that the effects of plasma-etching on the chemical bonds of TFE AF are similar to those of Ar-ion sputtering. New chemical bonds are formed, as indicated by comparing the two spectra with the spectrum of as-deposited TFE AF.

Using these methods to deposit photoresist and etch TFE AF films, trench lines and via holes can be patterned in TFE AF films. In addition, patterned metal/insulator/metal/ semiconductor structures can be fabricated with TFE AF as the insulator. Current-voltage and capacitance-voltage measurements of the TFE AF capacitors showed low leakage current and a relative dielectric constant of 1.9.

It should be noted that although TFE AF shows excellent resistance to wet chemicals, it can became unstable when it contacts Al during peroxide etching. It is believed that Al acts as a catalyst in this case and makes TFE AF react with peroxide.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a low-k layer in an integrated circuit, comprising:

depositing a low-k layer comprising a tetrafluoroethylene/ 2,2-bis(trifluoromethyl)-4,5-difluoro-1,3-dioxol copolymer on a partially completed integrated circuit, wherein the low-k layer has an exposed face;

dry etching the exposed face of the low-k layer;

depositing a photoresist layer on the etched, exposed face of the low-k layer;

patterning the photoresist layer to expose portions of the low-k layer;

depositing a mask layer on the patterned photoresist layer and exposed portions of the low-k layer, wherein the mask layer comprises aluminum;

removing the patterned photoresist layer and the portions of the mask layer overlying the patterned photoresist layer; and dry etching the integrated circuit to remove the low-k layer except in areas underlying the mask layer, whereby a patterned low-k layer is formed.

2. A method of forming a low-k layer in an integrated circuit, comprising:

depositing a low-k layer comprising a tetrafluoroethylene/ 2,2-bis(trifluoromethyl)-4,5-difluoro-1,3-dioxol copolymer on a partially completed integrated circuit, wherein the low-k layer has an exposed face;

dry etching the exposed face of the low-k layer;

depositing a photoresist layer on the etched, exposed face of the low-k layer;

patterning the photoresist layer to expose portions or the low-k layer;

depositing a mask layer on the patterned photoresist layer and exposed portions of the low-k layer;

removing the patterned photoresist layer and the portions of the mask layer overlying the patterned photoresist layer;

dry etching the integrated circuit to remove the low-k layer except in areas underlying the mask layer, whereby a patterned low-k layer is formed; and removing the mask layer.

3. The method of claim 2, further comprising removing the mask layer and forming a material layer over the patterned low-k layer.

4. The method of claim 3, wherein the material layer comprises a metal.

5. A method of forming a low-k layer in an integrated circuit, comprising:

depositing an amorphous low-k layer comprising tetrafluoroethylene on a partially completed integrated circuit, wherein the low-k layer has an exposed face;

roughening the exposed face of the low-k layer to increase the face's ability to adhere; and forming a layer of material on the roughened face of the low-k layer, wherein the layer of material comprises aluminum.

6. A method of forming a low-k layer in an integrated circuit, comprising:

depositing a low-k film layer comprising tetrafluoroethylene on a partially completed integrated circuit, wherein the low-k layer has an exposed face;

roughening the exposed face of the low-k layer to increase the face's ability to adhere;

forming a photoresist layer on the roughened face of the low-k layer, thereby forming a photoresist-covered low-k film; and patterning and etching the photoresist-covered low-k film.

7. The method of claim 6, wherein the low-k layer comprises a tetrafluoroethylene/2,2-bis(trifluoromethyl)-4,5-difluoro-1,3-dioxol copolymer.

8. The method of claim 6, wherein roughening the exposed face comprises dry etching.

9. The method of claim 6, wherein roughening the exposed face comprises plasma etching.

10. The method of claim 6, wherein roughening the exposed face comprises plasma etching in an $O_2$ atmosphere.

11. The method of claim 6, wherein roughening the exposed face comprises Ar-ion sputtering.

* * * * *